(12) United States Patent
Chauhan

(10) Patent No.: US 11,914,410 B2
(45) Date of Patent: Feb. 27, 2024

(54) ACCURACY TRIM ARCHITECTURE FOR HIGH PRECISION VOLTAGE REFERENCE

(71) Applicant: Texas Instruments Incorporated, Dallas, TX (US)

(72) Inventor: Rajat Chauhan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 41 days.

(21) Appl. No.: 17/682,335

(22) Filed: Feb. 28, 2022

(65) Prior Publication Data

US 2022/0390975 A1 Dec. 8, 2022

(30) Foreign Application Priority Data

Jun. 7, 2021 (IN) .............................. 202141025169

(51) Int. Cl.
*G05F 3/24* (2006.01)
*G05F 3/26* (2006.01)
*H03K 17/22* (2006.01)

(52) U.S. Cl.
CPC .................. *G05F 3/24* (2013.01); *G05F 3/26* (2013.01); *H03K 17/22* (2013.01)

(58) Field of Classification Search
CPC ....................................................... G05F 3/24
See application file for complete search history.

(56) References Cited

U.S. PATENT DOCUMENTS

| | | | |
|---|---|---|---|
| 7,049,889 B2 | 5/2006 | Kalb | |
| 7,319,346 B2 | 1/2008 | Shyr et al. | |
| 7,324,380 B2 | 1/2008 | Negut et al. | |
| 8,193,854 B2 | 6/2012 | Kuang et al. | |
| 8,581,657 B2 | 11/2013 | Itoh | |
| 9,153,578 B2 | 10/2015 | Scilla | |
| 2008/0265863 A1* | 10/2008 | Sugai | G05F 3/24 323/351 |
| 2008/0315857 A1* | 12/2008 | Sugimura | G05F 3/24 323/316 |
| 2019/0258284 A1* | 8/2019 | Sawano | G05F 5/00 |

* cited by examiner

*Primary Examiner* — Jue Zhang
*Assistant Examiner* — Lakaisha Jackson
(74) *Attorney, Agent, or Firm* — Ray A. King; Frank D. Cimino

(57) ABSTRACT

Described embodiments include a circuit for controlling a voltage drop. The circuit includes a resistor coupled between an output voltage terminal and a reference voltage terminal. First, second and third switches each have respective first, second and third switch terminals. The respective second switch terminals are connected together and are coupled to the output voltage terminal. The respective third switch terminals are connected together and are coupled to the reference voltage terminal. A first transistor is coupled between a supply voltage terminal and the first switch. A second transistor is coupled between the supply voltage terminal and the second switch. A third transistor is coupled between the supply voltage terminal and the third switch. Control terminals of the first, second and third transistors are coupled to a gate control terminal.

22 Claims, 3 Drawing Sheets

ACCURACY TRIM ARCHITECTURE FOR HIGH PRECISION VOLTAGE REFERENCE

CROSS-REFERENCE TO RELATED APPLICATION

This application claims priority to Indian Patent Application No. 202141025169 filed Jun. 7, 2021, which is incorporated herein by reference.

BACKGROUND

This description relates to high precision voltage reference integrated circuits, and to trimming the output voltage level of a series voltage reference integrated circuit for accuracy. In at least one example, a series voltage reference is a voltage reference generator circuit that is connected in series with a load, thereby providing current to the load at a reference voltage level. In contrast with a series voltage reference, a shunt voltage reference holds a node within the circuit at a particular voltage that serves as a reference point, with no current flowing through the shunt voltage reference.

Voltage references are usually specified to provide an accurate output voltage that remains steady across all conditions. In at least one system example, a voltage reference having an accuracy of 0.025% may be specified. In battery-powered applications, maintaining a low quiescent current (such as less than ten nanoamps) is helpful to achieve a long battery life.

SUMMARY

In a first example, a circuit for controlling a voltage drop includes a resistor coupled between an output voltage terminal and a reference voltage terminal. First, second and third switches each have respective first, second and third switch terminals. The respective second switch terminals are connected together and are coupled to the output voltage terminal. The respective third switch terminals are connected together and are coupled to the reference voltage terminal.

A first transistor is coupled between a supply voltage terminal and the first switch terminal of the first switch, and has a first control terminal coupled to a gate control terminal. A second transistor is coupled between the supply voltage terminal and the first switch terminal of the second switch, and has a second control terminal coupled to the gate control terminal. A third transistor is coupled between the supply voltage terminal and the first switch terminal of the third switch, and has a third control terminal coupled to the gate control terminal.

In a second example, a voltage reference circuit includes a first transistor having first and second current terminals and a first control terminal. The first current terminal is coupled to a supply voltage terminal, and the second current terminal is coupled to a gate control terminal. A second transistor has third and fourth current terminals and a second control terminal. The third current terminal is coupled to the supply voltage terminal, and the fourth current terminal is coupled to the first and second control terminals.

A third transistor has fifth and sixth current terminals and a third control terminal. The fifth current terminal is coupled to the gate control terminal. A fourth transistor has seventh and eighth current terminals and a fourth control terminal. The seventh current terminal is coupled to the fourth current terminal. The eighth current terminal is coupled to the sixth current terminal, and the fourth control terminal is coupled to a reference voltage terminal. A resistor is coupled between an output voltage terminal and the reference voltage terminal.

First, second and third switches each have respective first, second and third switch terminals. The respective second switch terminals are connected together and coupled to the output voltage terminal. The respective third switch terminals are connected together and coupled to the reference voltage terminal. A fifth transistor is coupled between the supply voltage terminal and the first switch terminal of the first switch, and has a fifth control terminal that is coupled to the gate control terminal.

A sixth transistor is coupled between the supply voltage terminal and the first switch terminal of the second switch, and has a sixth control terminal coupled to the gate control terminal. A seventh transistor is coupled between the supply voltage terminal and the first switch terminal of the third switch, and has a seventh control terminal coupled to the gate control terminal.

In a third example, a voltage reference integrated circuit includes a voltage trim circuit having a trim input and a trim output. The trim input is coupled to an input voltage terminal. A reference voltage generation circuit has a reference input and a reference output. The reference input is coupled to the trim output.

A buffer circuit has a buffer input and a buffer output. The buffer input is coupled to the trim output, and the buffer output is coupled to an output voltage terminal. A voltage at the reference output is adjusted by controlling a current through a resistor that is coupled to the reference output using a binary weighted current flow control circuit.

DETAILED DESCRIPTION

In this description, the same reference numbers depict same or similar (by function and/or structure) features. The drawings are not necessarily drawn to scale.

Precision voltage references having high accuracy throughout the operating temperature range are useful in many applications, including environmental sensors and medical applications where sensed signals with low amplitudes require high resolution. Portable and battery-powered applications may also have an additional specification of low quiescent current.

Figure 1:
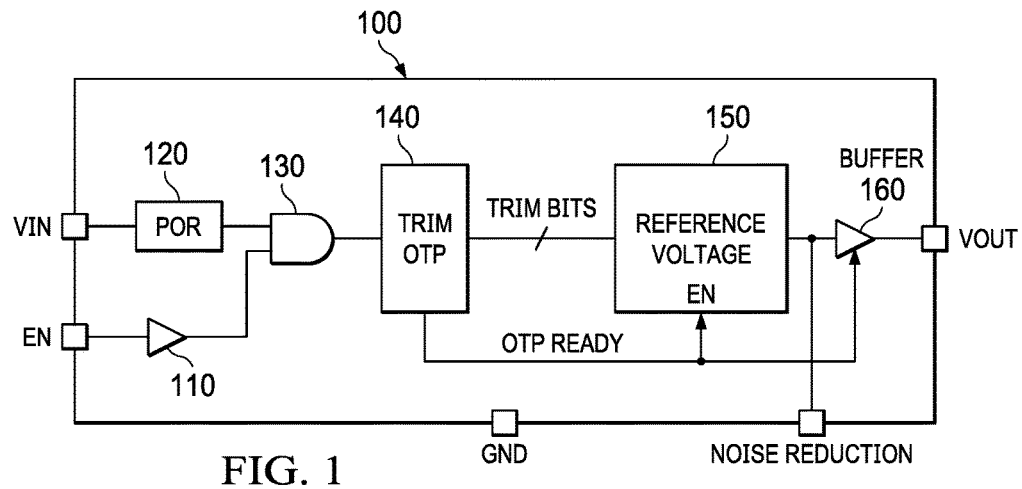
FIG. 1 shows a block diagram of a conventional voltage reference integrated circuit.

FIG. 1 shows a conventional voltage reference integrated circuit 100. A supply voltage source is provided to the VIN terminal of integrated circuit 100. A power-on-reset (POR) circuit 120 has an input coupled to the VIN terminal. The output of the power-on-reset circuit 120 is provided to a first input of AND gate 130. A second input of AND gate 130 receives an enable signal provided at the EN terminal of integrated circuit 100, which is coupled to the second input of AND gate 130 through a buffer 110.

The output of AND gate 130 is coupled to the input of the trim OTP (one-time programmable) circuit 140. A first output of trim OTP circuit 140 provides an OTP ready signal. A second output of trip OTP circuit 140 provides a trim value that is stored in memory. The first output of trim OTP circuit 140 is coupled to an enable terminal of reference voltage circuit 150, enabling or disabling (and powering down) the reference voltage circuit. The output of reference voltage circuit 150 provides a regulated voltage signal at a particular voltage. The trim value is provided to a trim input of reference voltage circuit 150, providing an adjustment signal to correct the voltage at the reference voltage circuit output.

The output of reference voltage circuit 150 is coupled to the input of buffer amplifier 160. The output of reference voltage circuit 150 is also coupled to the Noise Reduction terminal of voltage reference integrated circuit 100. A capacitor or a filter may be connected to the Noise Reduction terminal to filter noise at the output of reference voltage circuit 150 and provide a clean signal at the input of buffer amplifier 160. The output of buffer amplifier 160 is coupled to the output terminal $V_{OUT}$ of voltage reference integrated circuit 100, providing a known reference voltage having a specified output current drive capability.

Figure 2:
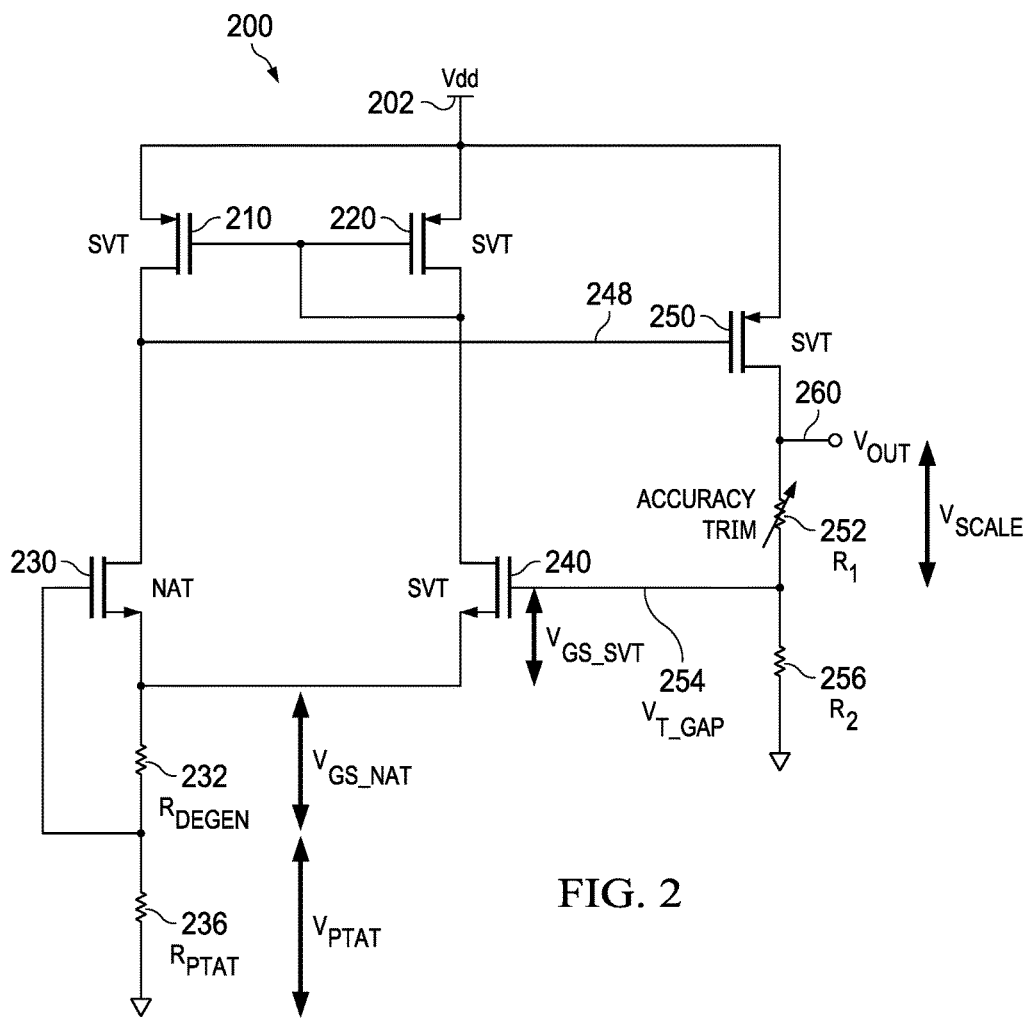
FIG. 2 shows a schematic diagram of an example reference voltage generation circuit.

FIG. 2 shows an example reference voltage generation circuit 200. $V_{dd}$ 202 is the supply voltage for the circuit. $V_{OUT}$ 260 is the output of the reference voltage generation circuit 200, providing the reference voltage output. Transistor 210 is a p-channel field effect transistor (PFET) having a source coupled to $V_{dd}$ 202. Transistor 220 is a PFET having a source coupled to $V_{dd}$ 202, and having a gate and a drain that are coupled to a gate of transistor 210.

Transistor 230 is an n-channel field effect transistor (NFET) having a drain coupled to the drain of transistor 210. Transistor 240 is an NFET having a drain coupled to the drain of transistor 220, and having a source coupled to the source of transistor 230. Resistors 232 and 236 are coupled in series between the source of transistor 230 and a ground terminal. The connection terminal between resistors 232 and 236 is coupled to the gate of transistor 230. Resistor 232 has a resistance value $R_{DEGEN}$, and resistor 236 has a resistance value $R_{PTAT}$.

Transistor 250 is a PFET having a source coupled to $V_{dd}$ 202, and having a gate coupled to the drain of transistor 210. Resistors 252 and 256 are coupled in series between the drain of transistor 250 and the ground terminal. The connection terminal between resistors 252 and 256 is $V_{T\_GAP}$ 254, which is coupled to the gate of transistor 240. Resistor 252 has a resistance value $R_1$, and resistor 256 has a resistance value $R_2$.

Resistor 252 is an adjustable resistor that can be used for trimming the output voltage at $V_{OUT}$ 260. Varying the resistance $R_1$ of resistor 252 varies the total resistance $(R_1+R_2)$ of series resistors 252 and 256. Varying the resistance $R_1$ also varies the ratio $(R_2/(R_1+R_2))$ of the resistance $R_2$ of resistor 256 to the total resistance $(R_1+R_2)$ of series resistors 252 and 256. Thus, varying the value of $R_1$ changes the voltage at $V_{OUT}$ 260.

$V_{OUT}$ 260 is generated from $V_{dd}$ 202 using transistors 210, 220, 230 and 240. Transistors 210 and 220 are PFETs, while transistors 230 and 240 are NFETs. Transistors 210, 220 and 240 are standard threshold voltage (SVT) transistors, while transistor 230 is a native threshold voltage transistor. A native threshold voltage NFET has a negative threshold voltage that may usually have a range of −100 mV to −150 mV. A standard threshold voltage NFET has a positive threshold voltage that may usually have a range of 600 mV to 700 mV. The reference voltage generated by reference voltage generation circuit 200 depends on transistors 230 and 240 having different threshold voltages, and further that one of the threshold voltages is negative and the other threshold voltage is positive.

The configuration of transistors 210, 220, 230 and 240 is similar to the configuration of a differential amplifier, except that transistors 230 and 240 are of different types. In an example differential amplifier, both transistors 230 and 240 would be standard threshold voltage transistors. However, in this embodiment, transistors 230 and 240 have different threshold voltages of opposite polarity for the proper operation of reference voltage generation circuit 200.

The voltage at the gate of transistor 240 is proportional to the difference in the threshold voltages between transistors 230 and 240. The voltage difference between the threshold voltages of transistors 230 and 240 is scaled up to a specified voltage level for $V_{OUT}$ 260 by the voltage divider formed by resistors 252 and 256. Transistors 210 and 220 can either be field effect transistors (FETs) or bipolar junction transistors (BJTs), but transistors 230 and 240 should be FETs to ensure proper operation of reference voltage generation circuit 200. If transistors 210 and 220 are BJTs, then the gate, source and drain in this description are replaced by a base, collector and emitter, respectively.

The voltage at $V_{OUT}$ 260 is adjusted by varying the value $R_1$ of resistor 252. The value $R_1$ of resistor 252 can be adjusted using trim bits stored in memory. Resistor 236 has a resistance value $R_{PTAT}$ and may be used for trimming the temperature coefficient of the voltage reference circuit. The voltage at $V_{OUT}$ 260 is given by equations (1) and (2):

$$V_{OUT}=V_{PTAT}+(V_{GS\_NAT}+V_{GS\_SVT})+V_{SCALE} \quad (1)$$

$$V_{OUT}=(V_{GS\_NAT}*(R_{PTAT}/R_{DEGEN})+V_{T\_GAP})*(1+(R_1/R_2)) \quad (2)$$

Figure 3:
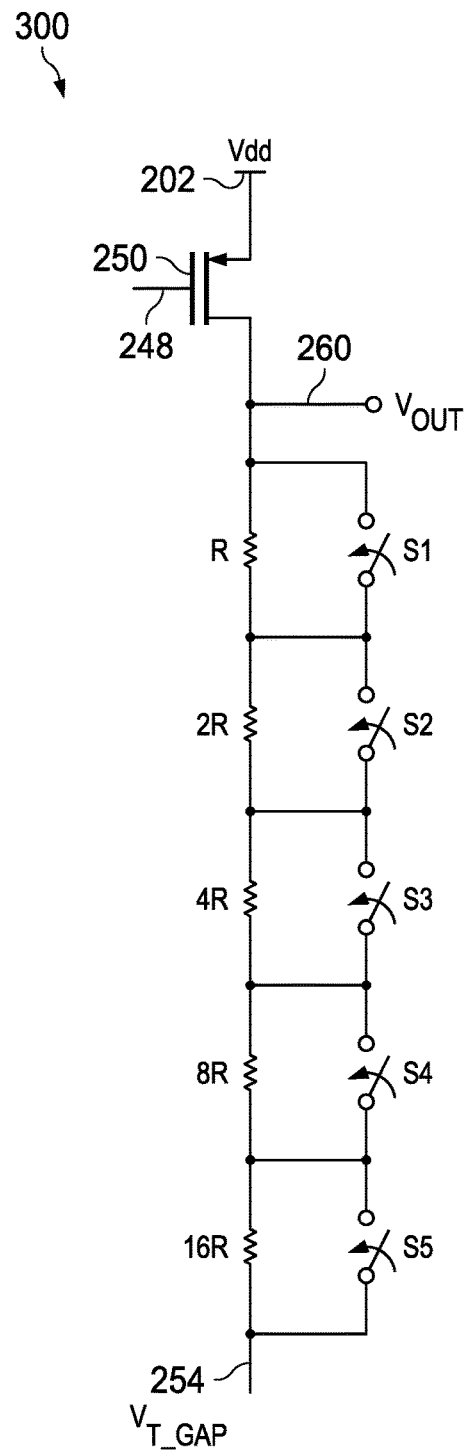
FIG. 3 shows a schematic diagram of an example circuit for generating a variable resistance in a reference voltage generation circuit using a binary weighted resistor ladder.

FIG. 3 shows an example circuit 300 for generating the variable resistance $R_1$ in the reference voltage generation circuit using a binary weighted resistor ladder. Transistor 250 is an SVT switch that is coupled between $V_{dd}$ 202 and $V_{OUT}$ 260. The variable resistance $R_1$ from FIG. 2 is replaced here by a resistor ladder coupled between $V_{OUT}$ 260 and $V_{T\_GAP}$ 254, in which each resistor of the resistor ladder has a switch connected in parallel with it. The resistance values of the resistors in the resistor ladder are binary weighted.

The first resistor in the resistor ladder has a resistance value of R, and has switch S1 connected in parallel with it. The second resistor in the resistor ladder has a resistance of 2*R, and has switch S2 connected in parallel with it. The third resistor in the resistor ladder has a resistance of 4*R, and has switch S3 connected in parallel with it. The fourth resistor in the resistor ladder has a resistance of 8*R, and has switch S4 connected in parallel with it. The fifth resistor in the resistor ladder has a resistance of 16*R, and has switch S5 connected in parallel with it.

The resistor ladder can produce a resistance value of any integer multiple of R from zero to 31*R (i.e. 0, R, 2*R, 3*R, 4*R, 5*R, . . . 31*R) based on which of switches S1-55 is/are turned on, and which of switches S1-55 is/are turned off. For a resistance of 16*R, switches S1-S4 are closed and switch S5 is open. For a resistance of 17*R, switches S2-S4 are closed, and switches S1 and S5 are open.

If the specified resistance is zero, all of switches S1-55 are closed. However, the switches S1-S5 do not actually have zero resistance. The drain-to-source resistance of the internal transistors in the switch produces a non-zero finite resistance between $V_{OUT}$ 260 and $V_{T\_GAP}$ 254. This finite resistance can create an inaccuracy in the voltage at $V_{OUT}$ 260. This circuit has five resistors connected in series to provide five bits of error correction. However, if a higher number of correction bits is needed to achieve the specified trim accuracy, the additional resistance between $V_{OUT}$ 260 and $V_{T\_GAP}$ 254 can make this problem even worse.

Figure 4:
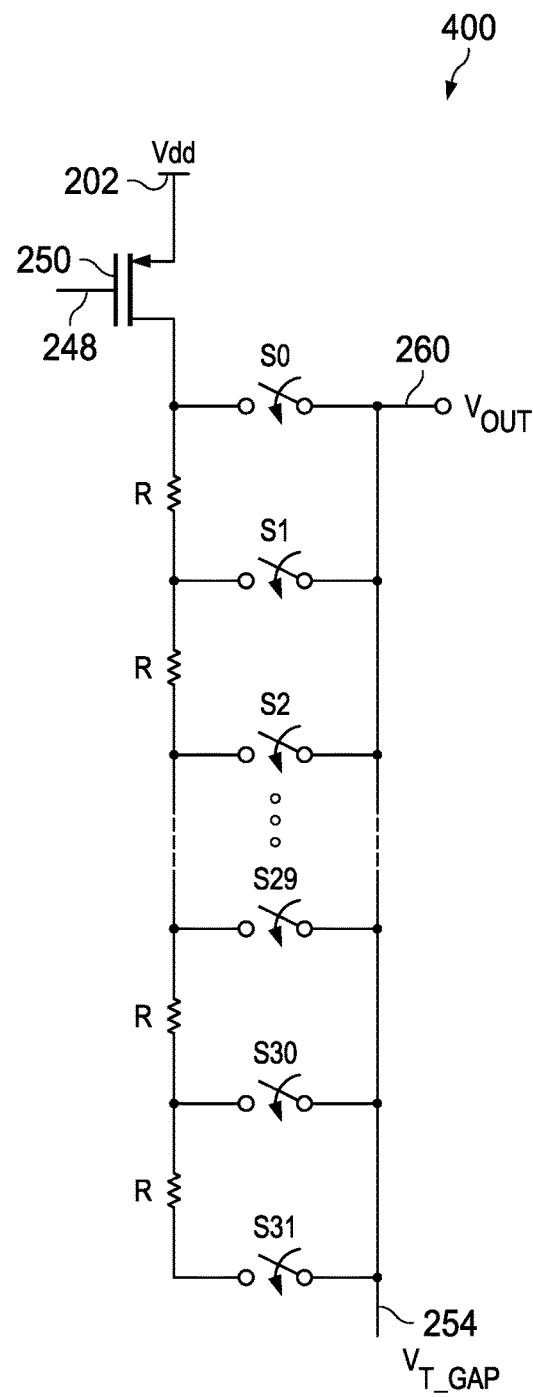
FIG. 4 shows a schematic diagram of an example circuit for generating a variable resistance in a reference voltage generation circuit using a one hot switch circuit.

FIG. 4 shows an example circuit 400 for generating the variable resistance $R_1$ between $V_{OUT}$ 260 and $V_{T\_GAP}$ 254 in a reference voltage generation circuit using a one hot switch control circuit. Transistor 250 is an SVT transistor coupled between $V_{dd}$ 202 and $V_{OUT}$ 260. The variable resistance R1 is implemented by a series of 31 resistors, each resistor having a resistance value of R. A respective switch of 32 switches is coupled between a respective terminal of each of the respective 31 resistors and $V_{T\_GAP}$ 254.

The variable resistance circuit is able to produce a resistance value of any integer multiple of R from zero to 31*R (i.e. 0, R, 2*R, 3*R, 4*R, 5*R, . . . 31*R), based on which one of switches S0-S31 is closed. Only one of switches S0-S31 can be closed at a time, and all the other switches are open.

If the specified resistance value is zero, then switch S0 is closed, and switches S1-S31 remain open. If the specified resistance value is 2*R, then switch S2 is closed, and all other switches remain open. Each switch of switches S0-S31 represents a resistance value that is an integer multiple of R from zero to 31*R. This circuit resolves a problem that would otherwise be caused by the binary weighted resistor ladder, because only one switch is turned on at a time, thereby resulting in a lower on resistance.

However, the one hot switch control circuit can lead to a different problem, due to the number of switches that are connected to the resistor ladder. The circuit has 31 resistors and 32 switches for five bits of trim resolution. At any particular time, 31 of the switches are off, and one of the switches is on. However, the off resistance of each switch is not infinite, so at least some leakage current flows through each switch when the switch is off. This leakage current adds to the bias current and creates an error in the output voltage $V_{OUT}$ 260.

Figure 5:
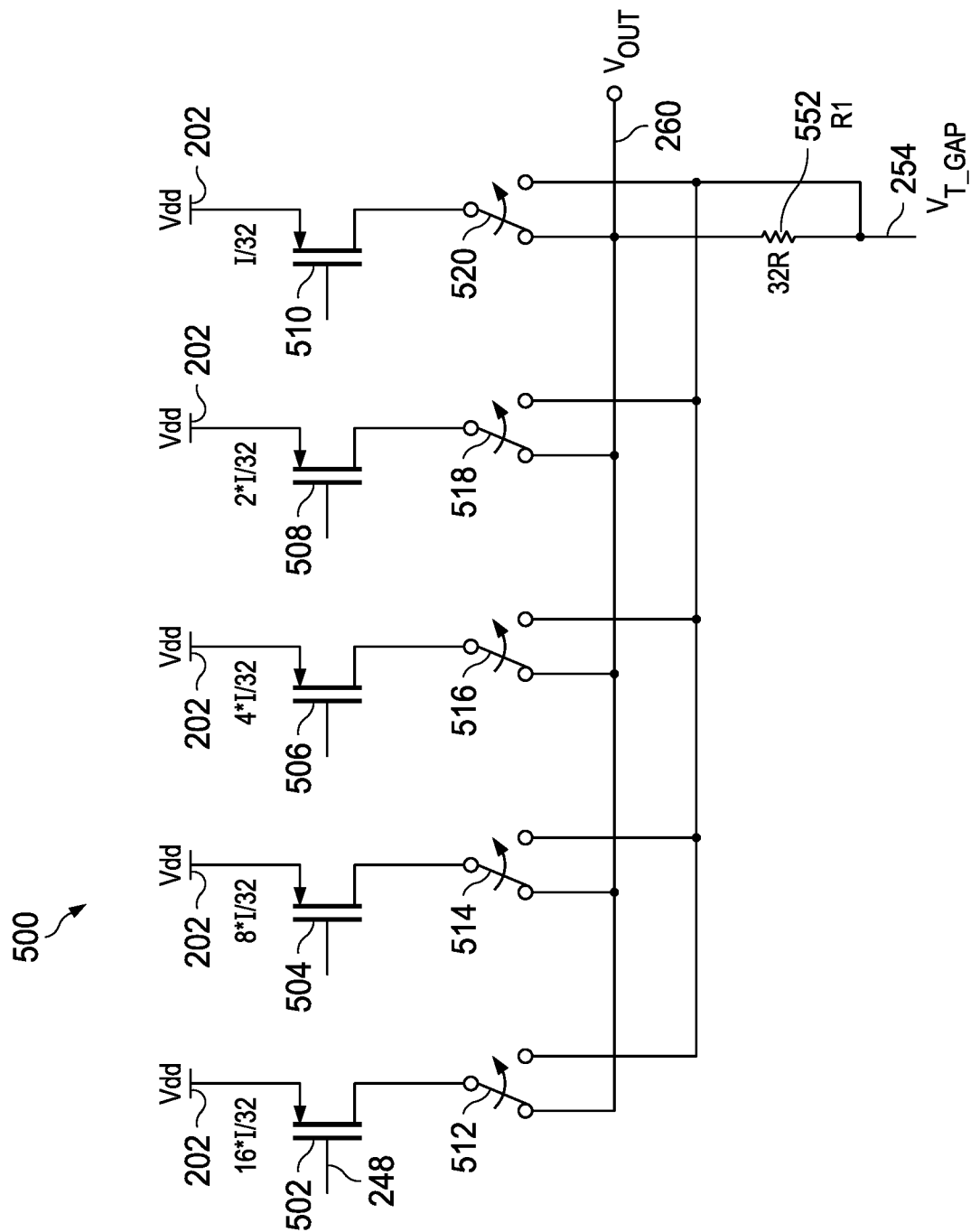
FIG. 5 shows a schematic diagram of an example circuit for a binary weighted current flow control circuit for controlling the voltage drop.

The voltage drop across a resistor can be controlled either by controlling the resistance of the resistor, or by controlling the current flowing through the resistor. Controlling the resistance by using a resistor ladder and switches can lead to errors in the output voltage. FIG. 5 shows a schematic diagram for a binary weighted current flow control circuit that controls the voltage drop between $V_{OUT}$ 260 and $V_{T\_GAP}$ 254 in a reference voltage generation circuit. The voltage at $V_{OUT}$ 260 is adjusted by controlling the amount of current that flows through R1, resistor 552, which has a fixed resistance value.

Binary-weighted switches control the amount of current flowing through resistor 552 to control the voltage drop across R1. Instead of controlling the voltage drop across R1, the current control operates by controlling the resistance of R1. The single SVT current branch coupled between $V_{dd}$ 202 and $V_{OUT}$ 260 in FIG. 2 is replaced by five binary weighted current branches. The binary weighted current branches include a respective transistor coupled between $V_{dd}$ 202 and a respective switch. Each respective switch selects between coupling the drain of the respective transistor to either $V_{OUT}$ 260 or $V_{T\_GAP}$ 254.

The first binary weighted current branch includes transistor 502 having a source coupled to $V_{dd}$ 202 and a drain coupled to switch 512. The second binary weighted current branch includes: transistor 504 having a source coupled to $V_{dd}$ 202; and a drain coupled to switch 514. The third binary weighted current branch includes: transistor 506 having a source coupled to $V_{dd}$ 202; and a drain coupled to switch 516. The fourth binary weighted current branch includes: transistor 508 having a source coupled to $V_{dd}$ 202; and a drain coupled to switch 518. The fifth binary weighted current branch includes: transistor 510 having a source coupled to $V_{dd}$ 202; and a drain coupled to switch 520.

The gates of transistors 502, 504, 506, 508 and 510 are connected together and coupled to the drain of transistor 230 (not shown in FIG. 5), and receive a gate control signal 248. When any of transistors 502, 504, 506, 508 or 510 is turned on, all of transistors 502, 504, 506, 508 and 510 are turned on, and current flows through each transistor. However, a same amount of current does not flow through each of the transistors. Also, the current from each respective transistor does not necessarily flow through a same path, because the current path from each respective transistor is controlled by a respective switch that directs the current to one of two paths.

Each of transistors 502, 504, 506, 508 and 510 is sized proportional to a current that is specified to flow through its respective branch. In at least one example, the respective currents through transistors 502, 504, 506, 508 and 510 are controlled by their respective widths. A current having a magnitude of 16/32*I flows through the first branch. A current having a magnitude of 8/32*I flows through the second branch. A current having a magnitude of 4/32*I flows through the third branch. A current having a magnitude of 2/32*I flows through the fourth branch. A current having a magnitude of 1/32 flows through the fifth branch.

Switches 512, 514, 516, 518 and 520 direct the currents from their respective transistors either through resistor 552 or around resistor 552, depending upon the position of each respective switch. In this way, the correct amount of current flows through resistor 552, and the correct voltage drop occurs between $V_{OUT}$ 260 and $V_{T\_GAP}$ 254. If switches 512, 514, 516, 518 or 520 are all connected to the terminal coupled to $V_{T\_GAP}$ 254, then no current will flow through resistor 552. If switches 512, 514, 516, 518 or 520 are all connected to the terminal coupled to resistor 552, then the maximum voltage drop will occur across resistor 552 because the maximum current will flow through resistor 552.

The binary weighted current flow control circuit 500 addresses both limitations (described above) that could otherwise happen when controlling voltage drop by controlling a resistance value. First, the switches 512, 514, 516, 518 and 520 are not in series with the R1 resistor, so no error is caused by the on resistance of the switches. Second, a smaller number of switches (in comparison to the one hot switch circuit) have a lower voltage error due to leakage current from the switches while the switches are in the off state.

In this description, "terminal," "node," "interconnection," "lead" and "pin" are used interchangeably. Unless specifically stated to the contrary, these terms generally mean an interconnection between or a terminus of a device element, a circuit element, an integrated circuit, a device, or other electronics or semiconductor component.

In this description, "ground" includes a chassis ground, an Earth ground, a floating ground, a virtual ground, a digital ground, a common ground and/or any other form of ground connection applicable to, or suitable for, the teachings of this description.

In this description, even if operations are described in a particular order, some operations may be optional, and the operations are not necessarily required to be performed in that particular order to achieve specified results. In some examples, multitasking and parallel processing may be advantageous. Moreover, a separation of various system components in the embodiments described above does not necessarily require such separation in all embodiments.

Modifications are possible in the described embodiments, and other embodiments are possible, within the scope of the claims.

What is claimed is:

1. A circuit for controlling a voltage drop, the circuit comprising:
   a resistor coupled between an output voltage terminal and a reference voltage terminal;
   first, second and third switches, each switch having respective first, second and third switch terminals, the respective second switch terminals connected together and coupled to the output voltage terminal, and the respective third switch terminals connected together and coupled to the reference voltage terminal;
   a first transistor coupled between a supply voltage terminal and the first switch terminal of the first switch, and having a first control terminal coupled to a gate control terminal;
   a second transistor coupled between the supply voltage terminal and the first switch terminal of the second switch, and having a second control terminal coupled to the gate control terminal; and
   a third transistor coupled between the supply voltage terminal and the first switch terminal of the third switch, and having a third control terminal coupled to the gate control terminal.

2. The circuit of claim 1, wherein the resistor is a first resistor, and the circuit further comprises a second resistor coupled between the reference voltage terminal and a ground terminal.

3. The circuit of claim 2, further comprising:
   a fourth transistor having first and second current terminals and a fourth control terminal, the first current terminal coupled to the supply voltage terminal, and the second current terminal coupled to the gate control terminal;
   a fifth transistor having third and fourth current terminals and a fifth control terminal, the third current terminal coupled to the supply voltage terminal, and the fourth current terminal coupled to the fourth and fifth control terminals;
   a sixth transistor having fifth and sixth current terminals and a sixth control terminal, the fifth current terminal coupled to the gate control terminal; and
   a seventh transistor having seventh and eighth current terminals and a seventh control terminal, the seventh current terminal coupled to the fourth current terminal, the eighth current terminal coupled to the sixth current terminal, and the seventh control terminal coupled to the reference voltage terminal.

4. The circuit of claim 3, further comprising:
   a third resistor coupled between the sixth current terminal and the sixth control terminal; and
   a fourth resistor coupled between the sixth control terminal and the ground terminal.

5. The circuit of claim 3, wherein the sixth transistor is a native threshold voltage FET, and the seventh transistor is a standard threshold voltage FET.

6. The circuit of claim 1, wherein a current through the first transistor is twice a current through the second transistor, and the current through the second transistor is twice a current through the third transistor.

7. The circuit of claim 6, wherein a width of the first transistor is twice a width of the second transistor, and the width of the second transistor is twice a width of the third transistor.

8. The circuit of claim 1, further comprising:
   fourth and fifth switches each having respective first, second and third switch terminals, the respective second switch terminals connected together and coupled to the output voltage terminal, and the respective third switch terminals connected together and coupled to the reference voltage terminal;
   a fourth transistor coupled between the supply voltage terminal and the first switch terminal of the fourth switch, and having a fourth control terminal coupled to the gate control terminal, in which a current through the third transistor is twice a current through the fourth transistor; and
   a fifth transistor coupled between the supply voltage terminal and the first switch terminal of the fifth switch, and having a fifth control terminal coupled to the gate control terminal, in which the current through the fourth transistor is twice a current through the fifth transistor.

9. The circuit of claim 8, wherein the fourth and fifth transistors are p-channel field effect transistors.

10. A voltage reference circuit, comprising:
    a first transistor having first and second current terminals and a first control terminal, the first current terminal coupled to a supply voltage terminal, and the second current terminal coupled to a gate control terminal;
    a second transistor having third and fourth current terminals and a second control terminal, the third current terminal coupled to the supply voltage terminal, and the fourth current terminal coupled to the first and second control terminals;
    a third transistor having fifth and sixth current terminals and a third control terminal, the fifth current terminal coupled to the gate control terminal;
    a fourth transistor having seventh and eighth current terminals and a fourth control terminal, the seventh current terminal coupled to the fourth current terminal, the eighth current terminal coupled to the sixth current terminal, and the fourth control terminal coupled to a reference voltage terminal;
    a resistor coupled between an output voltage terminal and the reference voltage terminal;
    first, second and third switches, each switch having respective first, second and third switch terminals, the respective second switch terminals connected together and coupled to the output voltage terminal, and the respective third switch terminals connected together and coupled to the reference voltage terminal;
    a fifth transistor coupled between the supply voltage terminal and the first switch terminal of the first switch, and having a fifth control terminal coupled to the gate control terminal;
    a sixth transistor coupled between the supply voltage terminal and the first switch terminal of the second switch, and having a sixth control terminal coupled to the gate control terminal; and
    a seventh transistor coupled between the supply voltage terminal and the first switch terminal of the third switch, and having a seventh control terminal coupled to the gate control terminal.

11. The voltage reference circuit of claim 10, wherein the resistor is a first resistor, and the voltage reference circuit further comprises a second resistor coupled between the reference voltage terminal and a ground terminal.

12. The voltage reference circuit of claim 11, further comprising:
a third resistor coupled between the sixth current terminal and the sixth control terminal; and
a fourth resistor coupled between the sixth control terminal and the ground terminal.

13. The voltage reference circuit of claim 10, further comprising:
fourth and fifth switches, each having respective first, second and third switch terminals, the respective second switch terminals connected together and coupled to the output voltage terminal, and the respective third switch terminals connected together and coupled to the reference voltage terminal;
an eighth transistor coupled between the supply voltage terminal and the first switch terminal of the fourth switch, and having an eighth control terminal coupled to the gate control terminal, in which a current through the seventh transistor is twice a current through the eighth transistor; and
a ninth transistor coupled between the supply voltage terminal and the first switch terminal of the fifth switch, and having a ninth control terminal coupled to the gate control terminal, in which the current through the eighth transistor is twice a current through the ninth transistor.

14. The voltage reference circuit of claim 10, wherein a current through the fifth transistor is twice a current through the sixth transistor, and the current through the sixth transistor is twice a current through the seventh transistor.

15. The voltage reference circuit of claim 10, wherein the third transistor is a native threshold voltage FET, and the fourth transistor is a standard threshold voltage FET.

16. The voltage reference circuit of claim 10, wherein a width of the fifth transistor is twice a width of the sixth transistor, and the width of the sixth transistor is twice a width of the seventh transistor.

17. The voltage reference circuit of claim 10, wherein the first and second transistors are p-channel field effect transistors.

18. A voltage reference integrated circuit, comprising:
a voltage trim circuit having a trim input and a trim output, the trim input coupled to an input voltage terminal;
a reference voltage generation circuit having a reference input and a reference output, the reference input coupled to the trim output; and
a buffer circuit having a buffer input and a buffer output, the buffer input coupled to the trim output, and the buffer output coupled to an output voltage terminal;
in which the reference voltage generation circuit is configured to adjust a voltage at the reference output by controlling a current through the reference output using a binary weighted current flow control circuit.

19. The voltage reference integrated circuit of claim 18, wherein the binary weighted current flow control circuit includes:
first, second and third switches, each switch having respective first, second and third switch terminals, the respective second switch terminals connected together and coupled to the reference output, and the respective third switch terminals connected together and coupled to a reference voltage terminal;
a first transistor coupled between the input voltage terminal and the first switch terminal of the first switch, and having a first control terminal coupled to a gate control terminal;
a second transistor coupled between the input voltage terminal and the first switch terminal of the second switch, and having a second control terminal coupled to the gate control terminal; and
a third transistor coupled between the input voltage terminal and the first switch terminal of the third switch, and having a third control terminal coupled to the gate control terminal.

20. The voltage reference integrated circuit of claim 18, further comprising a power-on-reset (POR) circuit having a POR input and a POR output, the POR input coupled to the input voltage terminal, and the POR output coupled to the trim input.

21. The voltage reference integrated circuit of claim 18, wherein the trim circuit includes a memory configured to store a trim adjustment value.

22. The voltage reference integrated circuit of claim 18, wherein the trim output is coupled to a noise reduction terminal, and the noise reduction terminal is adapted to be coupled to a filter.

* * * * *